(12) United States Patent
Moon

(10) Patent No.: US 10,256,370 B2
(45) Date of Patent: Apr. 9, 2019

(54) LIGHT EMITTING DEVICE

(71) Applicant: LG INNOTEK CO., LTD., Seoul (KR)

(72) Inventor: Ji Hyung Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/329,362

(22) Filed: Jul. 11, 2014

(65) Prior Publication Data

US 2015/0014735 A1 Jan. 15, 2015

(30) Foreign Application Priority Data

Jul. 11, 2013 (KR) .................. 10-2013-0081451

(51) Int. Cl.
*H01L 33/38* (2010.01)
*H01L 33/44* (2010.01)
(Continued)

(52) U.S. Cl.
CPC ........ *H01L 33/387* (2013.01); *H01L 33/0079* (2013.01); *H01L 33/22* (2013.01); *H01L 33/382* (2013.01); *H01L 33/44* (2013.01); *H01L 33/62* (2013.01); *H01L 33/0012* (2013.01); *H01L 33/0066* (2013.01); *H01L 33/0075* (2013.01); *H01L 33/06* (2013.01); *H01L 33/30* (2013.01);
(Continued)

(58) Field of Classification Search
CPC ..... H01L 33/382; H01L 33/387; H01L 33/44; H01L 33/405; H01L 33/62
See application file for complete search history.

(56) References Cited

U.S. PATENT DOCUMENTS

2006/0281203 A1 12/2006 Epler et al.
2009/0283787 A1 11/2009 Donofrio et al.
(Continued)

FOREIGN PATENT DOCUMENTS

CN 101867002 10/2010
CN 102301498 12/2011
(Continued)

OTHER PUBLICATIONS

European Search Report dated Dec. 3, 2014 issued in Application No. 14176413.4.

*Primary Examiner* — Yu Chen
(74) *Attorney, Agent, or Firm* — KED & Associates LLP

(57) ABSTRACT

The light emitting device includes a light emitting structure including a first conductive semiconductor layer, an active layer under the first conductive semiconductor layer, and a second conductive semiconductor layer under the active layer; a plurality of first electrodes disposed under the light emitting structure and electrically connected to the first conductive semiconductor layer by passing through the second conductive semiconductor layer, the active layer and a portion of the first conductive semiconductor layer; a second electrode disposed under the light emitting structure to be electrically connected to the second conductive semiconductor layer; a first insulating layer disposed around the first electrode to insulate the first electrode from the second electrode; a bonding layer electrically connected to the second electrode by passing through the first electrode and the first insulating layer; and a second insulating layer around the bonding layer.

13 Claims, 9 Drawing Sheets

(51) Int. Cl.
  H01L 33/62 (2010.01)
  H01L 33/00 (2010.01)
  H01L 33/22 (2010.01)
  H01L 33/40 (2010.01)
  H01L 33/42 (2010.01)
  H01L 33/06 (2010.01)
  H01L 33/32 (2010.01)
  H01L 33/30 (2010.01)

(52) U.S. Cl.
  CPC ............ *H01L 33/32* (2013.01); *H01L 33/405* (2013.01); *H01L 33/42* (2013.01); *H01L 2933/0016* (2013.01); *H01L 2933/0066* (2013.01)

(56) References Cited

U.S. PATENT DOCUMENTS

| | | |
|---|---|---|
| 2011/0210362 A1 | 9/2011 | Lee et al. |
| 2011/0272669 A1 | 11/2011 | Tan et al. |
| 2012/0001222 A1* | 1/2012 | Moon ................. H01L 33/44 257/99 |
| 2012/0007121 A1* | 1/2012 | Lee et al. .................. 257/98 |
| 2012/0032218 A1 | 2/2012 | Choi et al. |
| 2012/0086026 A1* | 4/2012 | Engl et al. .................. 257/93 |
| 2013/0049563 A1 | 2/2013 | Kim et al. |
| 2013/0052759 A1* | 2/2013 | Odnoblyudov ..... H01L 33/0079 438/14 |
| 2013/0062657 A1 | 3/2013 | Fang et al. |
| 2014/0021507 A1* | 1/2014 | Engl .................. H01L 33/405 257/99 |
| 2014/0061702 A1* | 3/2014 | Yamamoto ............ H01L 33/405 257/98 |

FOREIGN PATENT DOCUMENTS

| | | |
|---|---|---|
| CN | 103078033 | 5/2013 |
| EP | 2 405 491 A2 | 1/2012 |

\* cited by examiner

LIGHT EMITTING DEVICE

CROSS-REFERENCE TO RELATED APPLICATIONS

This application claims priority under 35 U.S.C. § 119 to Korean Patent Application No. 10-2013-0081451 filed on Jul. 11, 2013, whose entire disclosure is hereby incorporated by reference.

BACKGROUND

1. Field

The embodiment relates to a light emitting device, and more particularly, to a lighting device for improving light emitting efficiency.

2. Background

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of InxAlyGa1-x-yN ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

A via hole type LED according to the related art is formed in a junction structure of a P type semiconductor and an N type semiconductor, but the N type electrode is designed to have a large area although holes (+) have a drift velocity less than that of electrons (−).

For this reason, the spreading of holes is decreased due to the bottleneck in the movement of holes, so that the light efficiency of the light emitting device may be deteriorated.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Figure 1:
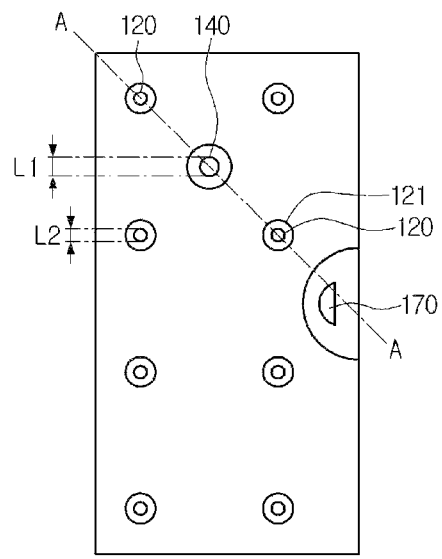
FIG. 1 is a plan view showing a light emitting device according to an embodiment.
Figure 2:
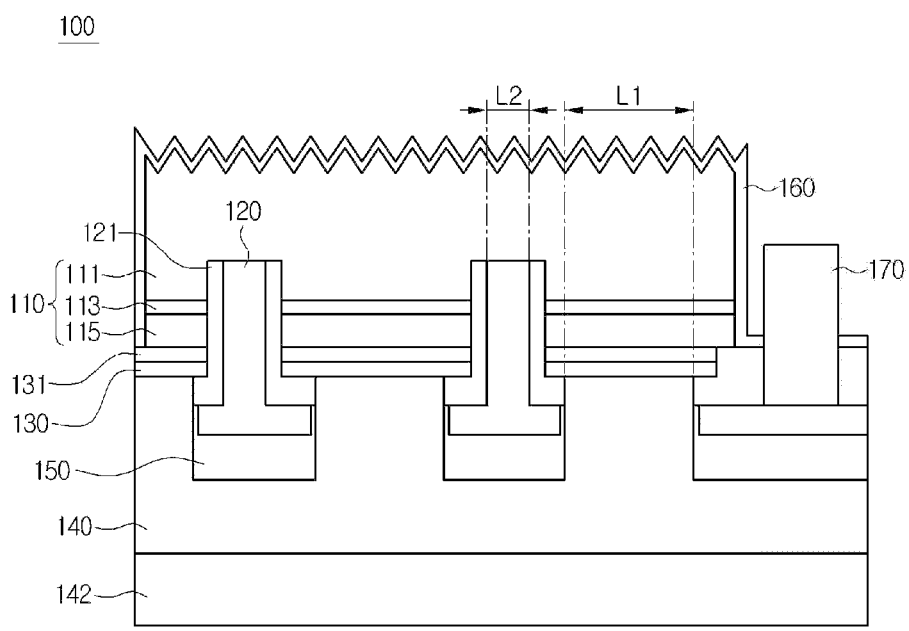
FIG. 2 is a sectional view taken along line A-A of FIG. 1.

FIG. 1 is a plan view showing a light emitting device according to an embodiment. FIG. 2 is a sectional view taken along line A-A of FIG. 1. Referring to FIGS. 1 and 2, the light emitting device 100 according to the embodiment includes a light emitting structure 110, a first electrode 120 disposed under the light emitting structure 110, a second electrode 130 interposed between the light emitting structure 110 and the first electrode 120, a first insulating layer 121 disposed around the first electrode 120, a bonding layer 140 disposed at a lower portion of the first electrode 120 such that the bonding layer 140 is electrically connected to the second electrode 130, and a second insulating layer 150 disposed around the bonding layer 140.

The light emitting structure 110 may include a first conductive semiconductor layer 111, an active layer 113, and a second conductive semiconductor layer 115. The active layer 113 may be interposed between the first conductive semiconductor layer 111 and the second conductive semiconductor layer 115. The active layer 113 may be provided under the first conductive semiconductor layer 111, and the second conductive semiconductor layer 115 may be provided under the active layer 113.

The first conductive semiconductor layer 111 may include an N-type semiconductor layer doped with N-type dopants serving as first conductive dopants, and the second conductive semiconductor layer 115 may include a P-type semiconductor layer doped with P-type dopants serving as second conductive dopants. In addition, the first conductive semiconductor layer 111 may include a P-type semiconductor layer, and the second conductive semiconductor layer 115 may include an N-type semiconductor layer.

For example, the first conductive semiconductor layer 111 may include an N-type semiconductor layer. The first conductive semiconductor layer 11 may be implemented by using a compound semiconductor. The first conductive semiconductor layer 111 may be implemented by using a group II-VI compound semiconductor, or a group III-V compound semiconductor.

For example, the first conductive semiconductor layer 111 may be implemented by using a semiconductor material having a compositional formula of InxAlyGa1-x-yN ($0 \leq x \leq 1$, $0 \leq y \leq 1$, $0 \leq x+y \leq 1$). For example, the first conductive semiconductor layer 111 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 113 emits light having a wavelength corresponding to the energy band gap difference according to materials constituting the active layer 113 through the combination of electrons (or holes) injected through the first conductive semiconductor layer 111 and holes (or electrons) injected through the second conductive semiconductor layer 115. The active layer 113 may have one of a single quantum well (SQW) structure, a multi-quantum well (MQW) structure, a quantum dot structure and a quantum wire structure, but the embodiment is not limited thereto.

For example, the active layer 113 may be implemented by using a compound semiconductor. The active layer 113 may be implemented by using a semiconductor material having a compositional formula of InxAlyGa1-x-yN ($0 \leq x \leq 1$, $0 \leq y \leq 1$, $0 \le x+y \le 1$). When the active layer 113 has an MQW structure, the active layer 113 may be formed by stacking a plurality of well layers and a plurality of barrier layers. For example, the active layer 113 may have a cycle of InGaN well layer/GaN barrier layer.

For example, the second conductive semiconductor layer 115 may include a P-type semiconductor layer. The second conductive semiconductor layer 115 may be implemented by using a compound semiconductor. For example, the second conductive semiconductor layer 115 may be implemented by using a group II-VI compound semiconductor, or a group III-V compound semiconductor.

For example, the second conductive semiconductor layer 115 may be implemented by using a semiconductor material having a compositional formula of $In_xAl_yGa1\text{-}x\text{-}yN$ ($0 \le x \le 1$, $0 \le y \le 1$, $0 \le x+y \le 1$). For example, the second conductive semiconductor layer 115 may include one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 111 may include a P-type semiconductor layer and the second conductive semiconductor layer 115 may include the N-type semiconductor layer. In addition, a semiconductor layer including an N-type or P-type semiconductor layer may be additionally provided under the second conductive semiconductor layer 115. Accordingly, the light emitting structure 110 may have at least one of an NP junction structure, a PN junction structure, an NPN junction structure and a PNP junction structure.

Impurities may be doped into the first conductive semiconductor layer 111 and the second conductive semiconductor layer 115 with uniform or non-uniform doping concentration. In other words, the light emitting structure 110 may have various structures, but the embodiment is not limited thereto.

In addition, a first conductive InGaN/GaN superlattice structure or InGaN/InGaN superlattice structure may be formed between the first conductive semiconductor layer 111 and the active layer 113. In addition, a second conductive AlGaN layer may be formed between the second conductive semiconductor layer 115 and the active layer 113.

The light emitting device may include a first electrode 120 disposed under the light emitting structure 110. The first electrode 120 may include an N type electrode and may pass through the second conductive semiconductor layer 115 and the active layer 113. For example, the first electrode 120 may be provided in a via hole structure and in a via plug type, so that the first electrode 120 may pass through the second conductive semiconductor layer 115 and the active layer 113.

The first electrode 120 may make electrical contact with the first conductive semiconductor layer 111. The first electrode 120 may be disposed in the first conductive semiconductor layer 111. The first electrode 120 may make contact with the first conductive semiconductor layer 111. For example, the first electrode 120 may include at least one among Cr, V, W, Ti, Zn, Ni, Cu, Al, Au and Mo.

The light emitting device according to the embodiment may include the second electrode 130 under the light emitting structure 110. The second electrode 130 may include a P type electrode and may be disposed under the second conductive semiconductor layer 115. The second electrode 130 may be electrically connected to the second conductive semiconductor layer 115.

The second electrode 130 may include a material having high reflectance. For example, the second electrode 130 may include metal including at least one of Ag, Ni, Al, Rh, Pd, Ir, Ru, Mg, Zn, Pt, Cu, Au and Hf, or the alloy thereof. In addition, the second electrode 130 may be formed in a multi-layer of the metal or the alloy thereof and a transmissive conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), or ATO (Antimony-Tin-Oxide). For example, according to the embodiment, the second electrode 130 may include at least one of Ag, Al, an Ag—Pd—Cu alloy, and an Ag—Cu alloy.

In addition, the light emitting device according to the embodiment may include an ohmic contact layer 131 interposed between the second conductive semiconductor layer 115 and the second electrode 130. The ohmic contact layer 131 may be formed to make ohmic contact with the light emitting structure 110. For example, the second electrode 130 may be electrically connected to the second conductive semiconductor layer 115 through the ohmic contact layer 131. The second electrode 130 reflects the light incident from the light emitting structure 110 so that a quantity of light extracted to an outside may be increased.

For example, the ohmic contact layer 131 may include a transparent conductive oxide layer. For instance, the ohmic contact layer 131 may be formed of at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, Ag and Ti.

The light emitting device according to the embodiment may include the first insulating layer 121. The first insulating layer 121 may be disposed around the first electrode 120 passing through the active layer and the second conductive semiconductor layer 115.

An upper surface of the first insulating layer 121 may be disposed in the first conductive semiconductor layer 111. The upper surface of the first insulating layer 121 may be formed in a hollow shape, and the first electrode may be disposed in a hollow region of the first insulating layer 121.

The upper surface of the first insulating layer 121 may be disposed on the same plane with an upper surface of the first electrode 120. To the contrary, the upper surface of the first insulating layer 121 may be disposed at a position higher than that of the upper surface of the first electrode 120. When the upper surface of the first insulating layer 121 may be disposed at a position higher than that of the upper surface of the first electrode 120, the holes generated from the first electrode 120 may be uniformly diffused.

The first insulating layer 121 may electrically insulate the first and second electrodes 120 and 130 from each other. The first insulating layer 121 may be interposed between the first and second electrodes 120 and 130. A lower surface of the first electrode 120 may be disposed at a position lower than that of a lower surface of the second electrode 130. The first electrode may be disposed under the second electrode 130.

For example, the first insulating layer 121 may include oxide or nitride. For example, the first insulating layer 121 may be formed of at least one selected from the group consisting of $SiO_2$, $Si_xO_y$, $Si_3N_4$, $Si_xN_y$, $SiO_xN_y$, $Al_2O_3$, $TiO_2$ and AlN.

The bonding layer 140 may be disposed under the first electrode 120. A portion of the bonding layer 140 may protrude through the first electrode 120 and the first insulating layer 121. The protrusion of the bonding layer 140 may make contact with the lower surface of the second electrode 130 such that the protrusion of the bonding layer 140 is electrically connected to the lower surface of the second electrode 130.

The bonding layer 140 may include barrier metal or bonding metal. For example, the bonding layer 140 may include at least one of Ti, Au, Sn, Ni, Cr, Ga, In, Bi, Cu, Ag, Nb, Pd and Ta.

A protrusion region of the bonding layer 140 may be disposed between the first electrodes 120 and a diameter of the protrusion region of the bonding layer 140 may be greater than that of the first electrode 120.

As described above, the bonding layer 140 is electrically connected to the second electrode 130, so that the P type electrode may become the entire bottom surface, thereby improving the spreading of holes.

The insulating layer 150 may be formed around the bonding layer 140. The second insulating layer 150 may electrically insulate the bonding layer 140 and the first electrode 120 from each other. Thus, the second insulating layer 150 may be disposed between the bonding layer 140 and the first electrode 120, between a side surface of the first electrode 120 and bonding layer 140, and between a lower surface of the first electrode 120 and the bonding layer 140.

For example, the second insulating layer 150 may include oxide or nitride. For example, the second insulating layer 150 may be formed of at least one selected from the group consisting of SiO2, SixOy, Si3N4, SixNy, SiOxNy, Al2O3, TiO2 and AlN.

The second insulating layer 150 may be formed of the same material as that of the first insulating layer 121. To the contrary, the second insulating layer 150 may be formed of a material different from that of the first insulating layer 121.

A support member 142 may be disposed under the bonding layer 140. For example, the support member 142 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W or impurities. For example, the support member 142 may be formed of an insulating material.

The light emitting device according to the embodiment may include a contact part 170. The contact part 170 may be disposed on a side surface of the light emitting structure 110. The contact part 170 may pass through the first insulating layer 121 such that the contact part 170 makes contact with the first electrode 120. Thus, the contact part 170 may allow electric power to be applied from an outside to the first electrode 120.

The contact part 170 may include at least one of Cr, V, W, Ti, Zn, Ni, Cu, Al, Au and Mo.

While the contact part 170 according to the related art is connected to the P type second electrode, the contact part 170 according to the embodiment is connected to the N type first electrode so that the compatibility with another light emitting device may be improved.

A roughness may be formed on the upper surface of the light emitting structure 110. A roughness may be formed on the upper surface of the first conductive semiconductor layer 111. A light extraction pattern may be provided on the upper surface of the light emitting structure 110. A concave-convex pattern may be provided on the upper surface of the light emitting structure 110. For example, the light extraction pattern provided to the light emitting structure 110 may be formed through a photo electro chemical (PEC) etching process. Thus, according to the embodiment, the external light extraction effect may be increased.

A protective layer 160 may be disposed the upper and side surfaces of the light emitting structure 110. The protective layer 160 may be disposed on the upper surface of the first conductive semiconductor layer 111. The protective layer 160 may be disposed on the side surface of the first conductive semiconductor layer 111. The protective layer 160 may be disposed on the side surfaces of the active layer 113 and the second conductive semiconductor layer 115. For example, the protective layer 160 may be formed of at least one selected from the group consisting of SiO2, SixOy, Si3N4, SixNy, SiOxNy, Al2O3, TiO2 and AlN.

As described above, according to the light emitting device of the embodiment, the bonding layer 140 is connected to the P type second electrode 130, so that the P type electrode may become the entire bottom surface of the light emitting chip, thereby improving the spreading of holes. In addition, according to the light emitting device of the embodiment, the contact layer 170 is connected to the first electrode 120, so that the compatibility with another light emitting device may be improved.

As described above, one P type electrode is formed between the first electrodes 120, but the embodiment is not limited thereto and may be implemented as follows.

Figure 3:
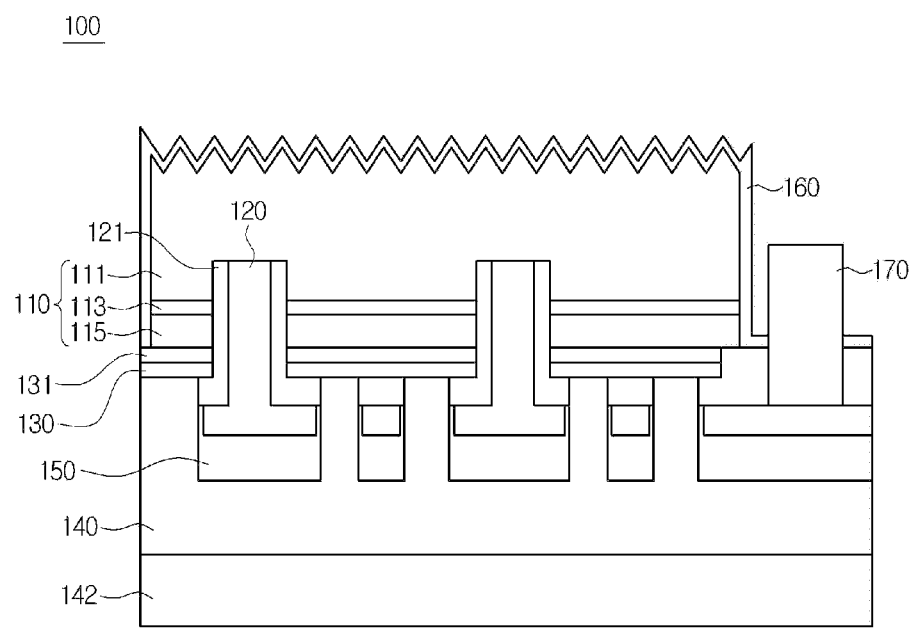
FIG. 3 is a sectional view showing one example of a modified light emitting device according to the embodiment.

FIG. 3 is a sectional view showing one example of a modified light emitting device according to the embodiment.

As shown in FIG. 3, the light emitting device 100 according to the embodiment includes a light emitting structure 110, a first electrode 120 disposed under the light emitting structure 110, a second electrode 130 interposed between the light emitting structure 110 and the first electrode 120, a first insulating layer 121 disposed around the first electrode 120, a bonding layer 140 disposed at a lower portion of the first electrode 120 such that the bonding layer 140 is electrically connected to the second electrode 130, and a second insulating layer 150 disposed around the bonding layer 140. Since the elements and configuration of the light emitting device except for the bonding layer 140 are the same as those of the light emitting device previously described above, the details thereof will be omitted.

The bonding layer 140 may be formed under the first electrode 120. The bonding layer 140 may include a plurality of protrusions which pass through the first electrode 120 and the first insulating layer 121. The protrusion of the bonding layer 140 may make contact with the lower surface of the second electrode 130 so that the protrusions are electrically connected to the lower surface of the second electrode 130.

The bonding layer 140 may have a plurality of protrusion regions, which may be disposed between the first electrodes 120. Diameters of the protrusion regions of the bonding layer 140 may be equal to or greater than a diameter of the first electrode 120.

The bonding layer 140 may include barrier metal or bonding metal. For example, the bonding layer 140 may include at least one of Ti, Au, Sn, Ni, Cr, Ga, In, Bi, Cu, Ag, Nb, Pd and Ta.

Hereinafter, a method of fabricating a light emitting device according to the embodiment will be described with reference to the accompanying drawings. FIGS. 4 to 12 are sectional views illustrating a method of fabricating a light emitting device according to the embodiment.

Figure 4:
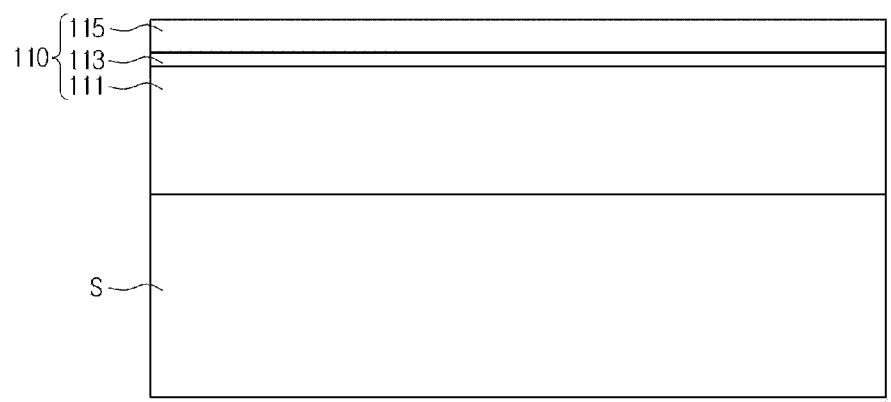
FIGS. 4 to 12 are sectional views illustrating a method of fabricating a light emitting device according to the embodiment.

According to the method of fabricating the light emitting device of the embodiment, as shown in FIG. 4, the first conductive semiconductor layer 111, the active layer 113, and the second conductive semiconductor layer 115 may be formed on a substrate S. The first conductive semiconductor layer 111, the active layer 113, and the second conductive semiconductor layer 115 may be defined as the light emitting structure 110.

For example, the substrate S may include at least one of a sapphire substrate (Al2O3), SiC, GaAs, GaN, ZnO, Si, GaP, InP and Ge, but the embodiment is not limited thereto. A buffer layer (not shown) may be interposed between the first conductive semiconductor layer 111 and the substrate S.

For example, the first conductive semiconductor layer 111 may include an N type semiconductor layer doped with N-type dopants serving as first conductive dopants, and the second conductive semiconductor layer 115 may include a P-type semiconductor layer doped with P-type dopants serving as second conductive dopants. To the contrary, the first conductive semiconductor layer 111 may include a P-type semiconductor layer, and the second conductive semiconductor layer 115 may include an N-type semiconductor layer.

For example, the first conductive semiconductor layer 111 may include an N-type semiconductor layer. The first conductive semiconductor layer 111 may include a semiconductor material having a compositional formula of $InxAlyGa1-x-yN$ ($0 \leq x \leq 1$, $0 \leq y \leq 1$, $0 \leq x+y \leq 1$). For example, the first conductive semiconductor layer 111 may include one selected from the group consisting of InAlGaN, GaN, AlGaN, AlInN, InGaN, AlN and InN, and may be doped with N-type dopants such as Si, Ge, Sn, Se and Te.

The active layer 113 emits light having a wavelength corresponding to the energy band gap difference according to materials constituting the active layer 113 through the combination of electrons (or holes) injected through the first conductive semiconductor layer 111 and holes (or electrons) injected through the second conductive semiconductor layer 115. The active layer 113 may have one of a single quantum well (SQW) structure, a multi-quantum well (MQW) structure, a quantum dot structure, and a quantum wire structure, but the embodiment is not limited thereto.

The active layer 113 may be implemented by using a semiconductor material having a compositional formula of $InxAlyGa1-x-yN$ ($0 \leq x \leq 1$, $0 \leq y \leq 1$, $0 \leq x+y \leq 1$). When the active layer 113 has an MQW structure, the active layer 12a may be formed by stacking a plurality of well layers and a plurality of barrier layers. For example, the active layer 113 may have a cycle of InGaN well layer/GaN barrier layer.

For example, the second conductive semiconductor layer 115 may be implemented by using a P type semiconductor layer. The second conductive semiconductor layer 115 may be formed by using a semiconductor material having a compositional formula of $InxAlyGa1-x-yN$ ($0 \leq x \leq 1$, $0 \leq y \leq 1$, $0 \leq x+y \leq 1$). For example, the second conductive semiconductor layer 115 may include one selected from the group consisting of InAlGaN, GaN, AlGaN, InGaN, AlInN, AlN, and InN, and may be doped with P-type dopants such as Mg, Zn, Ca, Sr and Ba.

Meanwhile, the first conductive semiconductor layer 111 may include a P-type semiconductor layer and the second conductive semiconductor layer 113 may include an N-type semiconductor layer. In addition, a semiconductor layer including an N-type or P-type semiconductor layer may be additionally provided on the second conductive semiconductor layer 115. Accordingly, the light emitting structure 110 may have at least one of an NP junction structure, a PN junction structure, an NPN junction structure and a PNP junction structure. In addition, impurities may be doped into the first conductive semiconductor layer 111 and the second conductive semiconductor layer 115 at uniform or non-uniform doping concentration. In other words, the light emitting structure 110 may have various structures, but the embodiment is not limited thereto.

In addition, the first conductive InGaN/GaN superlattice structure or InGaN/InGaN superlattice structure may be formed between the first conductive semiconductor layer 111 and the active layer 113. In addition, a second conductive AlGaN layer may be formed between the second conductive semiconductor layer 115 and the active layer 113.

Figure 5:
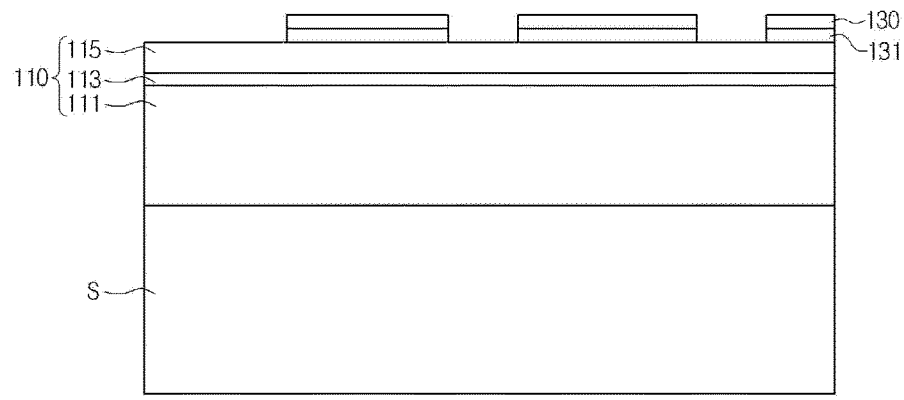

Then, as shown in FIG. 5, the ohmic contact layer 131 and the second electrode 130 may be sequentially formed on the light emitting structure 110. After the ohmic contact layer 131 and the second electrode 130 have been formed on the entire surface of the light emitting structure 110, the ohmic contact layer 131 and the second electrode 130 may be partly removed. In addition, the ohmic contact layer 131 and the second electrode 130 may be formed only on a predetermined region of the light emitting structure 110 by using a mask.

For example, the ohmic contact layer 131 may be formed of at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt and Ag.

The second electrode 130 may include a material having high reflectance. For example, the second electrode 130 may include metal including at least one of Ag, Ni, Al, Rh, Pd, Ir, Ru, Mg, Zn, Pt, Cu, Au and Hf, or the alloy thereof. In addition, the second electrode 130 may be formed in a multi-layer of the metal or the alloy thereof and a transmissive conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), or ATO (Antimony-Tin-Oxide). For example, according to the embodiment, the second electrode 130 may include at least one of Ag, Al, an Ag—Pd—Cu alloy, and an Ag—Cu alloy.

Figure 6:
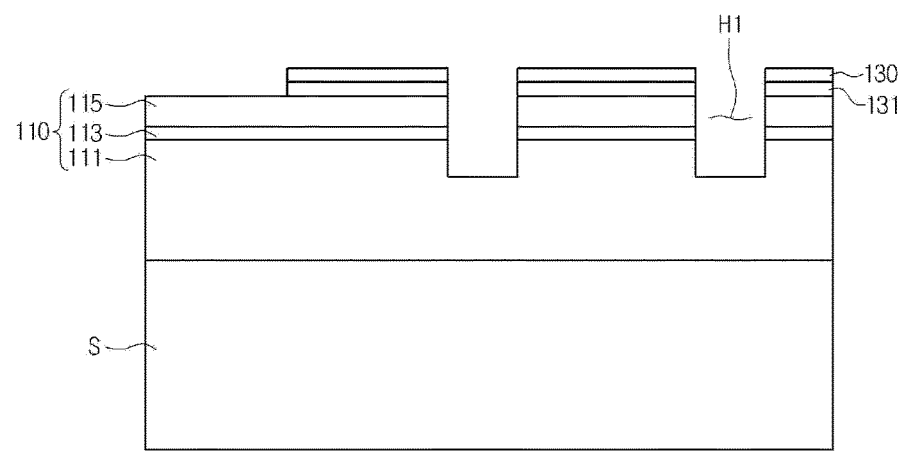

Next, as shown in FIG. 6, a step of forming a via hole H1 in the light emitting structure 110 may be performed. The via hole H1 may be formed by mesh-etching the light emitting structure 110. The via hole H1 may be formed in portions of the second conductive semiconductor layer 115, the active layer 113 and the first conductive semiconductor layer 11.

Figure 7:
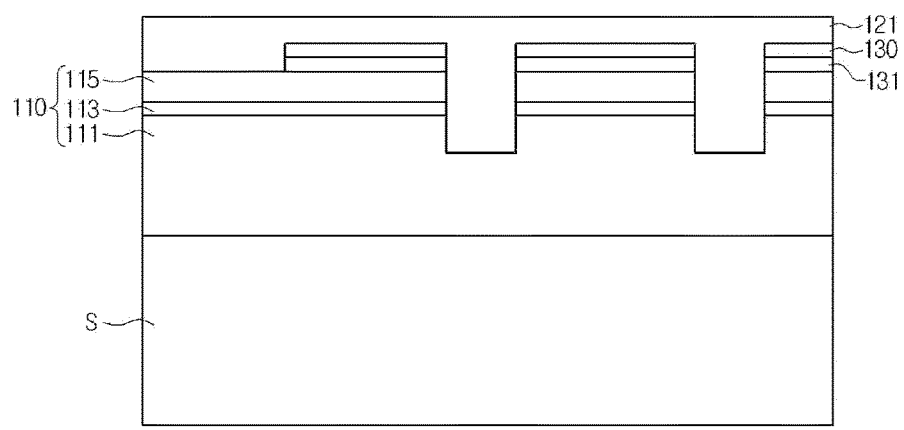

Then, as shown in FIG. 7, the first insulating layer 121 may be formed on the second electrode 130 through a deposition scheme. The first insulating layer 121 may be the upper portion of the second electrode 130 and in the via hole H1 which is formed in the second electrode and the ohmic contact layer 131.

The first insulating layer 121 may include oxide or nitride. For example, the first insulating layer 121 may be formed of at least one selected from the group consisting of SiO2, SixOy, Si3N4, SixNy, SiOxNy, Al2O3, TiO2 and AlN.

Figure 8:
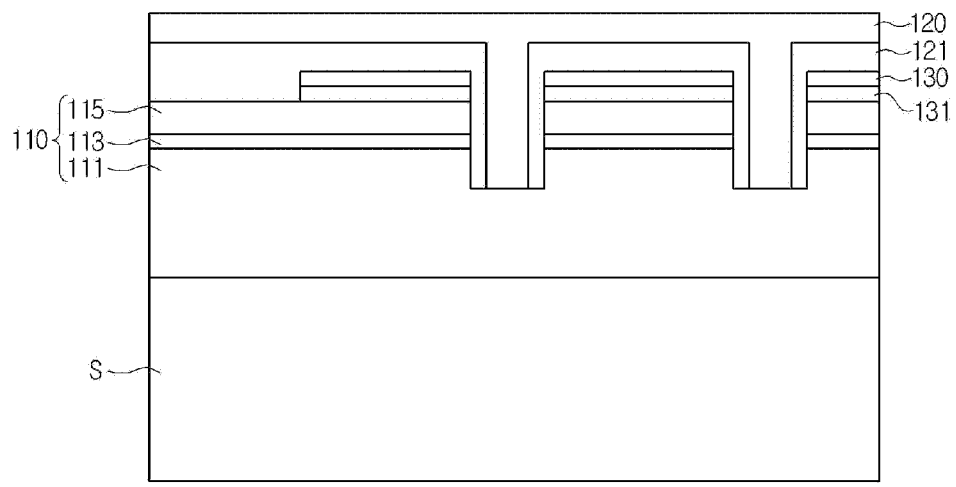

Then, as shown in FIG. 8, the first electrode 120 may be formed in the first insulating layer 121. The first electrode 120 may be electrically connected to the first conductive semiconductor layer 111. The first electrode 120 may make contact with the first conductive semiconductor layer 111. For example, the first electrode 120 may include at least one of Cu, Ni, Ti, Ti—W, Cr, W, Pt, V, Fe and Mo.

Figure 9:
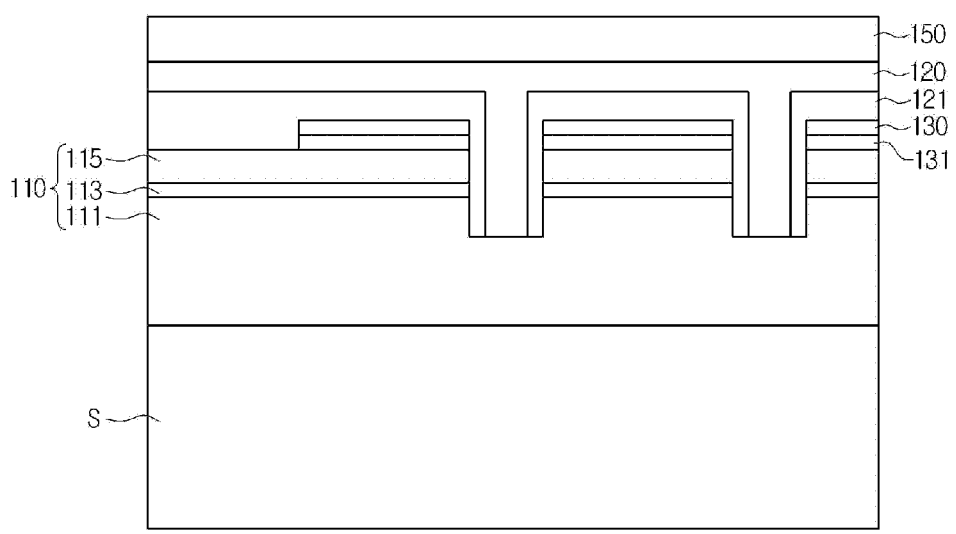

Then, as shown in FIG. 9, the second insulating layer 150 may be formed on the first electrode 120 through a deposition scheme. The second insulating layer 150 may be formed to cover the entire upper surface of the first electrode 120. The second insulating layer 150 may be formed of oxide or nitride. For example, the second insulating layer 150 may include at least one selected from the group consisting of SiO2, SixOy, Si3N4, SixNy, SiOxNy, Al2O3, TiO2 and AlN.

Figure 10:
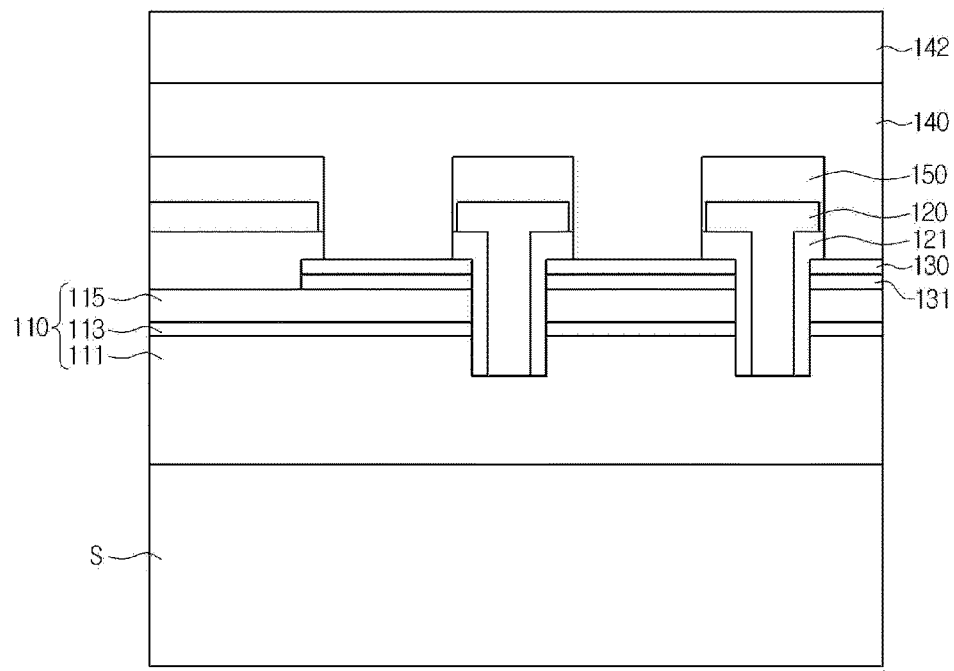

Then, as shown in FIG. 10, a step of forming the bonding layer 140 and the support member 142 on the second insulating layer 150 may be performed. The bonding layer 140 may be formed to make contact with the upper portions of the second insulating layer 150 and the second electrode 130. To this end, portions of the second insulating layer 150, the first electrode 120 and the first insulating layer 121 may be removed through an etching scheme.

In order to insulate the bonding layer 140 and the first electrode 120 from each other, after the second insulating layer 150 and the first electrode 120 are etched, the second insulating layer 150 may be additionally formed on the second insulating layer 150 and an inside surface of the first electrode 120. To the contrary, after a portion of the first electrode 120 is etched to be removed, the second insulating layer 150 may be formed on the upper portion of the first electrode 120.

Figure 11:
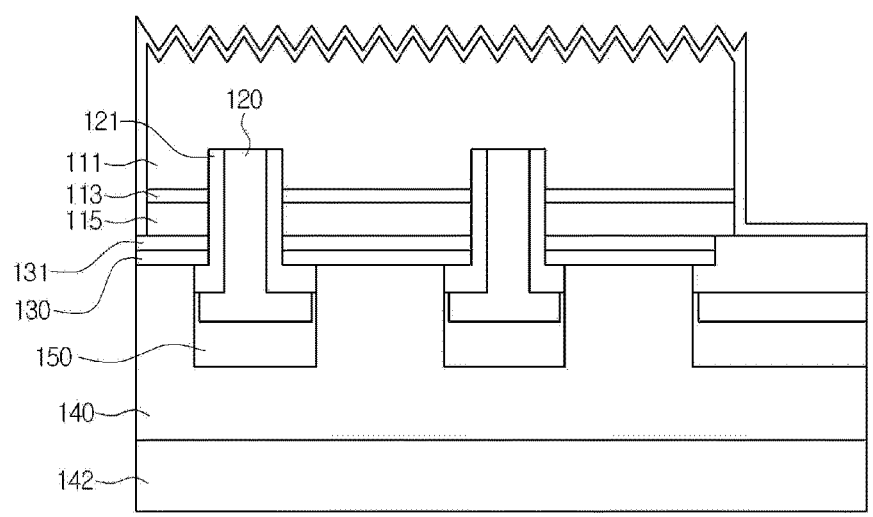

Then, as shown in FIG. 11, the substrate S is removed from the first conductive semiconductor layer 111. For example, the substrate S may be removed through a laser lift off (LLO) process. The LLO process is a process to delaminate the substrate S from the first conductive semiconductor layer 111 by irradiating a laser to the lower surface of the substrate S.

Then, the side surface of the light emitting structure 110 is etched through an isolation etching process to expose a portion of the first insulating layer 121. For example, the isolation etching process may be performed through a dry etching process such as inductively coupled plasma (ICP), but the embodiment is not limited thereto.

The roughness may be formed on the upper surfaces of the light emitting structure 110. A light extraction pattern may be provided on the upper surface of the light emitting structure 110. A concave-convex pattern may be provided on the light emitting structure 110. For example, the light extraction pattern provided on the light emitting structure 110 may be formed through a PEC (Photo Electro Chemical) etching process. Therefore, according to the embodiment, the external light extraction effect can be increased.

The protective layer 160 may be formed on the light emitting structure 100. The protective layer 160 may be formed to cover the side surfaces of the active layer 113 and the second conductive semiconductor layer 115. For example, the protective layer 160 may include at least one selected from the group consisting of SiO2, SixOy, Si3N4, SixNy, SiOxNy, Al2O3, TiO2 and AlN.

Figure 12:
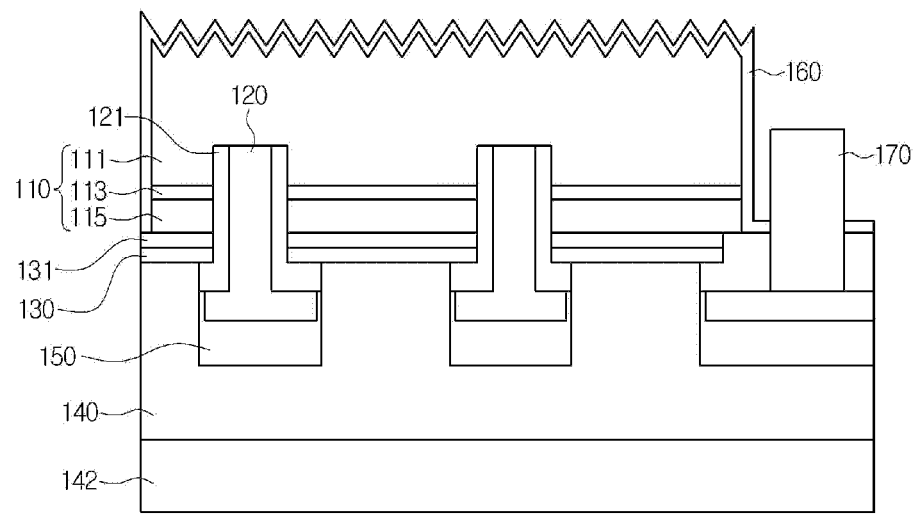

Then, as shown in FIG. 12, the contact part 170 may be formed on the first electrode 120. An electric power may be applied from an outside to the first electrode 120 through the contact part 170. For example, the contact part 170 may include at least one of Cr, V, W, Ti, Zn, Ni, Cu, Al and Au.

The processes of forming each layer described above are provided for the illustrative purpose, and the process sequence thereof may be variously modified.

Figure 13:
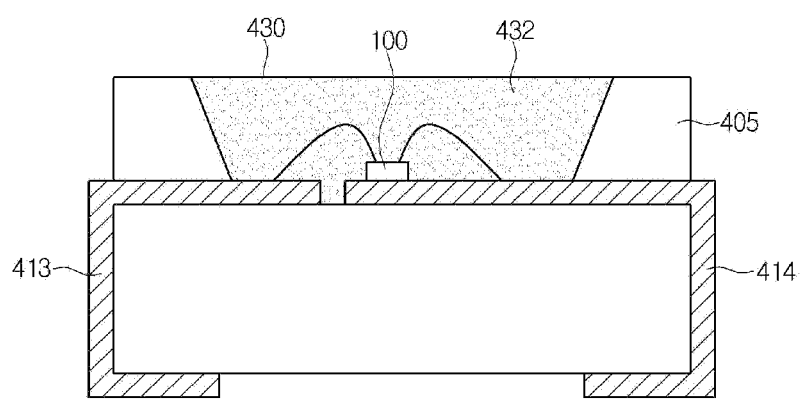
FIG. 13 is a sectional view showing a light emitting device package according to the embodiment.

FIG. 13 is a sectional view showing a light emitting device package according to the embodiment. The light emitting device according to the embodiment may be mounted on the light emitting device package according to the embodiment.

The light emitting device package 400 includes a package body 405, third and fourth electrode layers 413 and 414 disposed on the package body 405, a light emitting device 100 electrically connected to the third and fourth electrode layers 413 and 414, and a molding member 430 surrounding the light emitting device 100.

The package body 405 may include a silicon material, a synthetic resin material or a metallic material, and an inclined surface may be formed in the vicinity of the light emitting device 100.

The third and fourth electrode layers 413 and 414 are electrically isolated from each other to supply power to the light emitting device 100. In addition, the third and fourth electrode layers 413 and 414 may improve the light efficiency by reflecting the light generated from the light emitting device 100 and may dissipate heat generated from the light emitting device 100 to the outside The light emitting device 100 may be disposed on the package body 405 or the third or fourth electrode layers 413 or 414.

The light emitting device 100 may be electrically connected to the third and/or fourth electrode layers 413 and/or 414 through one of a wire scheme, a flip-chip scheme, and a die-bonding scheme. Although it is proposed as on example that the light emitting device 100 is electrically connected to the third and fourth electrode layers 413 and 414 through wires, the embodiment is not limited thereto.

The molding member 430 may surround the light emitting device 100 to protect the light emitting device 100. In addition, the molding member 430 may include phosphors 432 to change the wavelength of the light emitted from the light emitting device 100.

Figure 14:
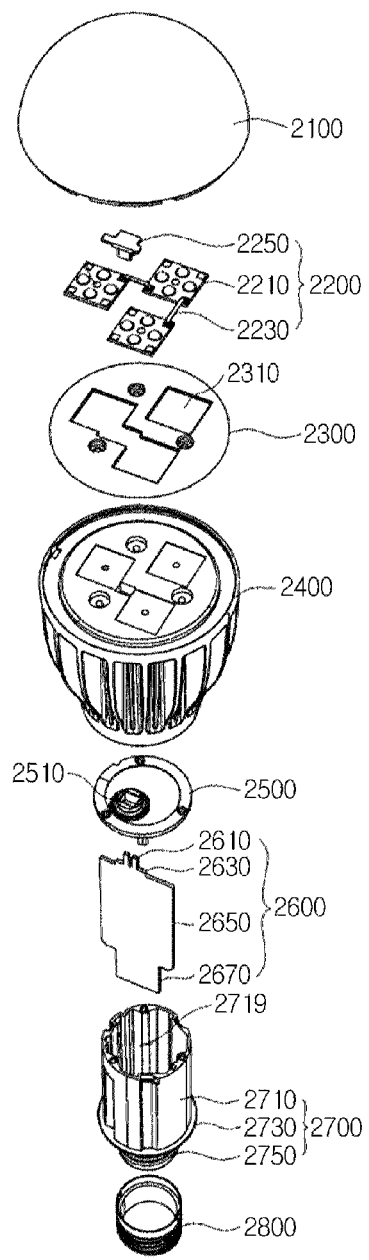
FIGS. 14 to 16 are exploded perspective views illustrating a lighting system including a light emitting device according to the embodiment.
Figure 15:
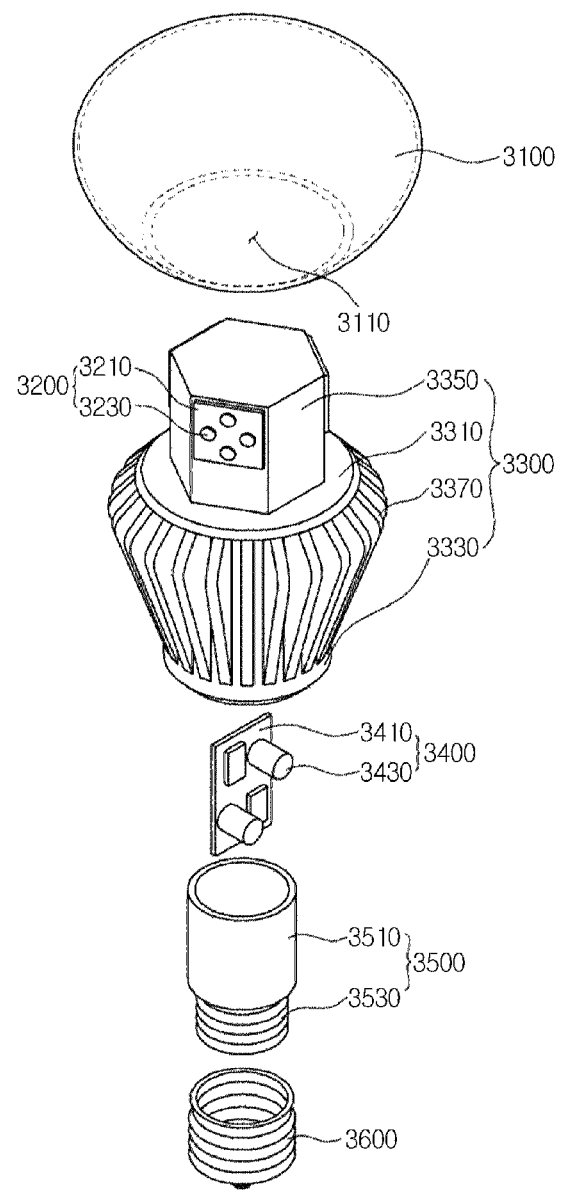
Figure 16:
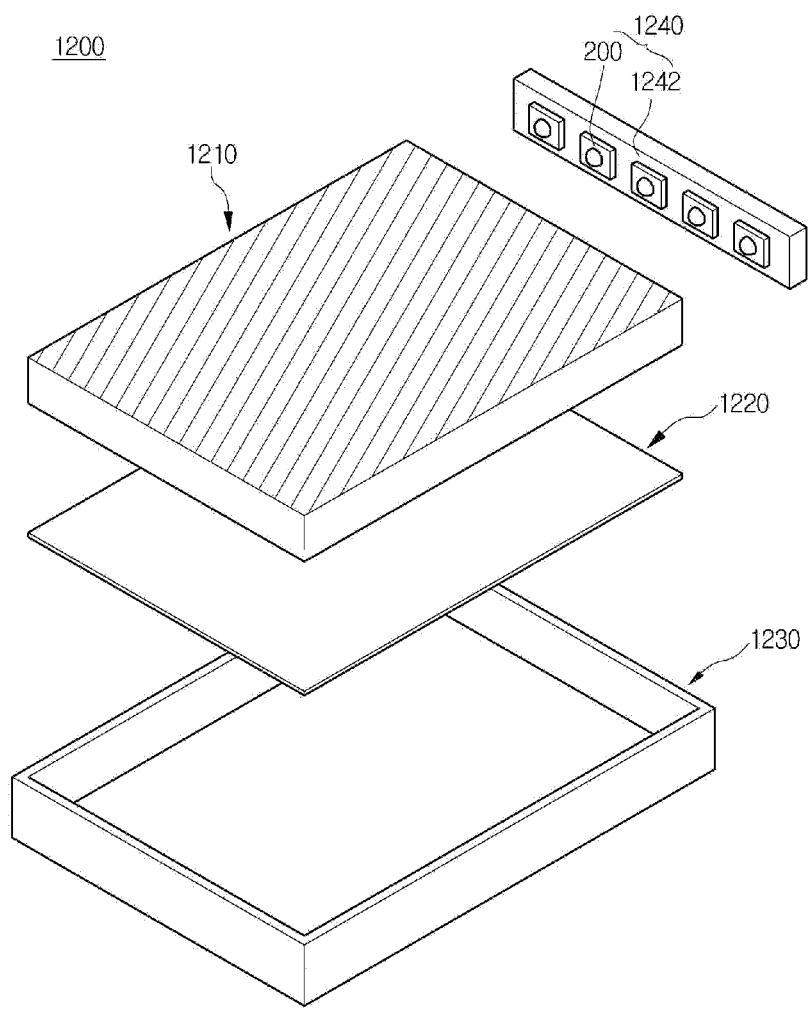

FIGS. 14 to 16 are exploded perspective views illustrating a lighting system including a light emitting device according to the embodiment.

Referring to FIG. 14, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device 100 or the light emitting device package 400 according to the embodiment.

For example, the cover 2100 may have a bulb shape or a hemispheric shape. The cover 2100 may have a hollow structure which is partially open. The cover 2100 may be optically coupled to the light source module 2200. For example, the cover 2100 may diffuse, scatter, or excite light provided from the light source module 2200. The cover 2100 may be an optical member. The cover 2100 may be coupled to the radiator 2400. The cover 2100 may include a coupling part which is coupled to the radiator 2400.

The cover 2100 may include an inner surface coated with a milk-white pigment. The milk-white pigment may include a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

In addition, as shown in FIG. 15, the lighting apparatus according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a bulb shape and is hollow. The cover 3100 has an opening 3110. The light source part 3200 and a member 3350 may be inserted through the opening 3110.

The cover 3100 may be coupled to the radiator 3300, and may surround the light source part 3200 and the member 3350. The light source part 3200 and the member 3350 may be blocked from the outside by the coupling between the cover 3100 and the radiator 3300. The cover 3100 may be coupled to the radiator 3300 by an adhesive or various schemes such as a rotation coupling scheme and a hook coupling scheme. The rotation coupling scheme is a scheme where a thread of the cover 3100 is engaged with a screw groove of the radiator 3300, and the cover 3100 is coupled to the radiator 3300 by rotation of the cover 3100. The hook coupling scheme is a scheme where a projection of the cover 3100 is inserted into a groove of the radiator 3300 so that the cover 3100 is coupled to the radiator 3300.

The cover 3100 may be optically coupled to the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source parts may be disposed. In detail, the light source part 3200 may be disposed in at least one of a plurality of side surfaces of the member 3350. A top end of the light source part 3200 may be disposed at the side surface of the member 3350.

The light source part 3200 may be disposed at three of six side surfaces of the member 3350. However, the embodiment is not limited thereto, and the light source part 3200 may be disposed at all side surfaces of the member 3350. The light source part 3200 may include a substrate 3210 and a light emitting device 3230. The light emitting device 3230 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator. For example, the typical printed circuit board (PCB) may include a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled to the cover 3100, and may radiate heat from the light source part 3200. The radiator 3300 has a predetermined volume, and includes a top surface 3310 and a side surface 3330. The member 3350 may be disposed on the top surface 3310 of the radiator 3310. The top surface 3310 of the radiator 3300 may be coupled to the cover 3100. The top surface 3310 of the radiator 3300 may have a shape corresponding to an opening 3110 of the cover 3100.

A plurality of heat radiation pins 3370 may be disposed at the side surface 3330 of the radiator 3300. The heat radiation pin 3370 may extend outward from the side surface of the radiator 3300 or may be connected to the side surface of the radiator 3300. The heat radiation pin 3370 may improve heat radiation efficiency by increasing a heat radiation area of the radiator 3300. The side surface 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six side surfaces. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six side surfaces of the member 3350. The light source part 3200 may be disposed at all or some of the six side surfaces of the member 3350. FIG. 15 shows the light source part 3200 which is disposed at three of the six side surfaces of the member 3350.

The substrate 3210 is disposed at the lateral side of the member 3350. The lateral side of the member 3350 may be substantially vertical to the top surface of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity of a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board 3410 may have an elliptical shape or a polygonal shape. The circuit board 3410 may be provided by printing a circuit pattern on an insulator.

The circuit board 3410 is electrically connected to the substrate 3210 of the light source part 3200. For example, the circuit part 3410 and the substrate 3210 may be electrically connected to each other by a wire. The wire may be disposed inside the radiator 3300 to connect the substrate 3210 to the circuit board 3410.

For example, a plurality of components 3430 may include a direct current converter to convert AC power provided from an external power supply into DC power, a driving chip to control driving of the light source part 3200, and an electrostatic discharge (ESD) protective device to protect the light source part 3200.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents the circuit part 3400 from being short circuited to the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 3600 may have a screw groove structure corresponding to a thread structure of the connecting part 3530.

In addition, as shown in FIG. 16, a lighting apparatus such as a backlight according to the embodiment may include a light guide plate 1210, a light emitting module 1240 for supplying light to the light guide plate 1210, a reflective member 1220 under the light guide plate 1210, and a bottom cover 1230 for receiving the light guide plate 1210, the light emitting module 1240 and the reflective member 1220. However, the embodiment is not limited to the above configuration.

The light guide plate 1210 diffuses the light to provide surface light. The light guide plate 1210 may include transparent material. For example, the light guide plate 1210 may include one of acryl-based resin such as PMMA (polymethyl methacrylate), PET (polyethylene terephthalate), PC (polycarbonate), COC (cyclic olefin copolymer) and PEN (polyethylene naphthalate) resin.

The light emitting module 1240 supplies the light to at least one side of the light guide plate 1210. The light emitting module 1240 serves as the light source of the display device.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 may be adjacent to the light guide plate 1210, but the embodiment is not limited thereto.

The substrate 1242 may be a printed circuit board (PCB: not shown) including a circuit pattern. In addition, the substrate 1242 may also include a metal core PCB (MCPCB) or a flexible PCB (FPCB) as well as a general PCB, but the embodiment is not limited thereto.

In addition, the light emitting device packages 200 may be installed such that light emitting surfaces of the light emitting device packages 200 are spaced apart from the light guide plate 1210 by a predetermined distance.

The reflective member 1220 may be disposed under the light guide plate 1210. The reflective member 1220 reflects the light, which incident on the bottom surface of the light guide plate 1210, upwardly, thereby improving the brightness of the light unit 1050. For example, the reflective member 1220 may be formed of PET, PC or PVC resin, but the embodiment is not limited thereto.

The bottom cover 1230 may receive the light guide plate 1210, the light emitting module 1240, and the reflective member 1220 therein. To this end, the bottom cover 1230 may be formed in a box shape having an opened top surface, but the embodiment is not limited thereto.

The bottom cover 1230 may be formed of a metallic material or a resin material, and may be manufactured through a press process or an extrusion process.

The embodiment provides a light emitting device in which the spreading of holes is improved so that the efficiency of the light emitting device may be improved.

According to the embodiment, there is provided a light emitting device including a light emitting structure including a first conductive semiconductor layer, an active layer under the first conductive semiconductor layer, and a second conductive semiconductor layer under the active layer; a plurality of first electrodes disposed under the light emitting structure and electrically connected to the first conductive semiconductor layer by passing through the second conductive semiconductor layer, the active layer and a portion of the first conductive semiconductor layer; a second electrode disposed under the light emitting structure to be electrically connected to the second conductive semiconductor layer; a first insulating layer disposed around the first electrode to insulate the first electrode from the second electrode; a bonding layer electrically connected to the second electrode by passing through the first electrode and the first insulating layer; and a second insulating layer around the bonding layer.

According to the light emitting device of the embodiment, the bonding layer is connected to the P type second electrode such that the P type electrode constitutes the entire chip bottom surface, thereby enhancing the spreading of holes.

In addition, according to the light emitting device of the embodiment, a contact layer is connected to the first electrode, so that the compatibility with another light emitting device may be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including first and second conductive semiconductor layers, and an active layer between the first and second conductive semiconductor layers;
a first electrode electrically connected to the first conductive semiconductor layer by passing through the second conductive semiconductor layer, the active layer and a portion of the first conductive semiconductor layer, wherein the first electrode includes first electrode portions and second electrode portions, wherein each of the first electrode portions separately extends in a first direction through the second conductive semiconductor layer, the active layer and the portion of the first conductive semiconductor layer, wherein each of the second electrode portions separately extends in a second direction and contacts a separate corresponding one of the first electrode portions, wherein the first electrode is an N-type electrode;

a second electrode electrically connected to the second conductive semiconductor layer, wherein the second electrode is a p-type electrode;

a first insulating layer between the first electrode and the second electrode to insulate the first electrode from the second electrode, wherein the first insulating layer includes a first insulating portion that extends in the first direction to surround part of each of the first electrode portions of the first electrode and that vertically extends in the first direction to a position higher than a top of the first electrode portions of the first electrode, and wherein an upper surface of the first insulating portion of the first insulating layer is formed in a hollow shape;

a bonding layer electrically connected to the second electrode, which is a p-type electrode;

a support member under the bonding layer such that the bonding layer is between the support member and the second electrode;

a second insulating layer provided between the bonding layer and the first electrode, wherein the second insulating layer is formed of a material different from the first insulating layer, wherein a first insulating portion of the second insulating layer is between the second electrode portions and the bonding layer;

a contact electrode provided on a side surface of the light emitting structure, and the contact electrode is electrically connected to a third electrode portion of the first electrode, wherein the third electrode portion extends in the second direction, wherein a second insulating portion of the second insulating layer is provided under the third electrode portion of the first electrode such that the third electrode portion is between the contact electrode and the second insulating portion of the second insulating layer;

a protective layer on an entire upper surface and side surfaces of the first conductive semiconductor layer, and the protective layer to surround the contact electrode, wherein the protective layer includes a first side portion, a second side portion, an upper portion and an extended portion, wherein the first side portion of the protective layer vertically extends in the first direction, wherein the extended portion extends in the second direction from the second side portion and has a flat upper surface, and the contact electrode passes through the flat upper surface of the extended portion of the protective layer, wherein an upper surface of the upper portion of the protective layer corresponding to the first electrode is a disposed pattern, wherein a first edge portion of the second electrode is under the first side portion of the protective layer, and a second edge portion of an upper surface of the second electrode is not in contact with the second side portion of the protective layer and is not in contact with the extended portion of the protective layer that surrounds the contact electrode, and wherein a second insulating portion of the first insulating layer surrounds the contact electrode and contacts one edge portion of a lower surface of the second conductive semiconductor layer, and wherein the first electrode portions includes a first one of the first electrode portions and a second one of the first electrode portions, wherein the first one of the first electrode portions, the second one of the first electrode portions and the contact electrode are aligned in the second direction such that the first one of the first electrode portions is between, in the second direction, the contact electrode and the second one of the first electrode portions, wherein the active layer has a portion that is directly between the first one of the first electrode portions and the second one of the first electrode portions, and the portion of the active layer extends continuously between the first insulating portion that surrounds the first one of the first electrode portions and the first insulating portion that surrounds the second one of the first electrode portions, wherein the bonding layer includes a plurality of bonding protrusions that contact the second electrode, wherein a first one of the bonding protrusions is provided between the first one of the first electrode portions and the contact electrode, the first one of the bonding protrusions is provided between the second electrode portion that contacts the first one of the first electrode portions and the third electrode portion, and the first one of the bonding protrusions is provided between the first insulating portion of the second insulating layer and the second insulating portion of the second insulating layer, wherein a second one of the bonding protrusions extends between the second one of the first electrode portions and the first one of the first electrode portions such that the second one of the bonding protrusions contact the second electrode, and a third one of the bonding protrusions extends between the second one of the first electrode portions and the first one of the first electrode portions such that the third one of the bonding protrusions contact the second electrode, wherein a third insulating portion of the second insulation layer is between the second one of the bonding protrusions and the third one of the bonding protrusions, wherein the contact electrode has a first width in the second direction, wherein the third electrode portion has a second width in the second direction between a first end and a second end, wherein the first end of the third electrode portion is vertically overlapped in the first direction with the second electrode, and the second end of the third electrode portion is aligned with the second insulating portion of the first insulating layer that surrounds the contact electrode, wherein the second insulating portion of the second insulating layer has a third width in the second direction between a third end and a fourth end, wherein the third end of the second insulating portion of the second insulating layer is vertically overlapped in the first direction with the second electrode such that the third electrode portion is between the second insulating portion of the second insulating layer and the second insulating portion of the first insulating layer that surrounds the contact electrode, and the fourth end of the second insulating portion of the second insulating layer is aligned with the second insulating portion of the first insulating layer that surrounds the contact electrode, wherein the second width is greater than the first width, and the third width is greater than the first width.

2. The light emitting device of claim 1, wherein the second insulating layer insulates the first electrode from the bonding layer.

3. The light emitting device of claim 2, wherein the second insulating layer is formed between the first electrode and the bonding layer, between a side surface of the first electrode and the bonding layer and between a lower surface of the first electrode and the bonding layer.

4. The light emitting device of claim 1, wherein the flat upper surface of the protective layer that surrounds the contact electrode has no pattern.

5. The light emitting device of claim 4, wherein the contact electrode makes contact with the third electrode portion of the first electrode through an opening in the first insulating layer.

6. The light emitting device of claim 5, wherein an ohmic contact layer is provided between the second electrode and the second conductive semiconductor layer.

7. The light emitting device of claim 6, wherein an upper surface of the ohmic contact layer adjacent to the contact electrode does not contact the protective layer.

8. The light emitting device of claim 1, wherein the first and second side portions of the protective layer are provided on side surfaces of the active layer and the second conductive semiconductor layer.

9. The light emitting device of claim 1, wherein an upper surface of the first conductive semiconductor layer has an uneven or rough surface.

10. A light emitting device comprising:
a light emitting structure including first and second conductive semiconductor layers, and an active layer between the first and second conductive semiconductor layers;
a plurality of first electrodes electrically connected to the first conductive semiconductor layer by passing through the second conductive semiconductor layer, the active layer and a portion of the first conductive semiconductor layer, wherein each of the plurality of first electrodes includes a first electrode portion and a second electrode portion, wherein the first electrode portions extend in a first direction through the second conductive semiconductor layer, the active layer and the portion of the first conductive semiconductor layer, wherein each of the second electrode portions separately extends in a second direction and contacts a separate corresponding one of the first electrode portions, wherein the plurality of first electrodes is an N-type electrode;
a second electrode electrically connected to the second conductive semiconductor layer, wherein the second electrode is a p-type electrode;
a first insulating layer between the first electrodes to insulate the first electrodes from the second electrode, wherein the first insulating layer includes a first insulating portion that extends in the first direction to surround part of each of the first electrode portions of the first electrodes and that vertically extends in the first direction to a position higher than a top of the first electrode portions of the first electrodes, and wherein an upper surface of the first insulating portion of the first insulating layer is formed in a hollow shape;
a bonding layer electrically connected to the second electrode, which is a p-type electrode;
a support member under the bonding layer such that the bonding layer is between the support member and the second electrode;
a second insulating layer provided between the bonding layer and the plurality of first electrodes, wherein the second insulating layer is formed of a material different from the first insulating layer, wherein a first insulating portion of the second insulating layer is between the second electrode portions of the first electrodes and the bonding layer;
a contact electrode provided on a side surface of the light emitting structure and is electrically connected to a third electrode portion that is connected to the first electrodes, wherein the third electrode portion extends in the second direction, wherein a second insulating portion of the second insulating layer is provided under the third electrode portion of the first electrodes such that the third electrode portion is between the contact electrode and the second insulating portion of the second insulating layer; and
a protective layer on an entire upper surface and side surfaces of the first conductive semiconductor layer and to surround the contact electrode, wherein the protective layer includes a first side portion, a second side portion, an upper portion and an extended portion, wherein the first side portion of the protective layer vertically extends in the first direction, wherein the extended portion extends from the second side portion in the second direction and has a flat upper surface, and the contact electrode passes through the flat upper surface of the extended portion of the protective layer,
wherein a first edge portion of the second electrode is under the first side portion of the protective layer, and a second edge portion of an upper surface of the second electrode is not in contact with the second side portion of the protective layer and is not in contact with the extended portion of the protective layer that surrounds the contact electrode,
wherein a first one of the first electrodes include a first one of the first electrode portions and a second one of the first electrodes include a second one of the first electrode portions, wherein the first one of the first electrode portions, the second one of the first electrode portions and the contact electrode are aligned in the second direction such that the first one of the first electrode portions is between, in the second direction, the contact electrode and the second one of the first electrode portions,
wherein the active layer has a portion that is directly between the first one of the first electrode portions and the second one of the first electrode portions, and the portion of the active layer extends continuously between the first insulating portion that surrounds the first one of the first electrode portions and the first insulating portion that surrounds the second one of the first electrode portions,
wherein the bonding layer includes a plurality of bonding protrusions that contact the second electrode, wherein a first one of the bonding protrusions is provided between the first one of the electrode portions and the contact electrode, the first one of the bonding protrusions is provided between the second electrode portion that contacts the first one of the first electrode portions and the third electrode portion, and the first one of the bonding protrusions is provided between the first insulating portion of the second insulating layer and the second insulating portion of the second insulating layer,
wherein a second one of the bonding protrusions extends between the second one of the first electrode portions and the first one of the first electrode portions such that the second one of the bonding protrusions contact the second electrode, and a third one of the bonding protrusions extends between the second one of the first electrode portions and the first one of the first electrode portions such that the third one of the bonding protrusions contact the second electrode, wherein a third insulating portion of the second insulation layer is between the second one of the bonding protrusions and the third one of the bonding protrusions, wherein the contact electrode has a first width in the second direction, wherein the third electrode portion has a second width in the second direction between a first end and a second end, wherein the first end of the third electrode portion is vertically overlapped in the first direction with the second electrode, and the second end of the third electrode portion is aligned with a second insulating portion of the first insulating layer that surrounds the contact electrode, wherein the second insulating portion of the second insulating layer has a third width in the second direction between a third end and a fourth end, wherein the third end of the second insulating portion of the second insulating layer is vertically overlapped in the first direction with the second electrode such that the third electrode portion is between the second insulating portion of the second insulating layer and the second insulating portion of the first insulating layer that surrounds the contact electrode, and the fourth end of the second insulating portion of the second insulating layer is aligned with the second insulating portion of the first insulating layer that surrounds the contact electrode, wherein the second width is greater than the first width, and the third width is greater than the first width.

11. The light emitting device of claim 10, wherein the second insulating layer insulates the first electrodes from the bonding layer.

12. The light emitting device of claim 10, wherein the contact electrode makes contact with the third electrode portion through an opening of the first insulating layer.

13. The light emitting device of claim 10, further including
an ohmic contact layer provided between the second electrode and the second conductive semiconductor layer.

* * * * *